(12) United States Patent
Dürr et al.

(10) Patent No.: US 11,067,953 B2
(45) Date of Patent: Jul. 20, 2021

(54) APPARATUS AND METHOD FOR GENERATING AN OPTICAL PATTERN FROM IMAGE POINTS IN AN IMAGE PLANE

(71) Applicant: Fraunhofer-Gesellschaft zur Förderung der angewandten Forschung e.V., München (DE)

(72) Inventors: Peter Dürr, Dresden (DE); Alexander Mai, Dresden (DE)

(73) Assignee: FRAUNHOFER-GESELLSCHAFT ZUR FÖRDERUNG DER ANGEWANDTEN FORSCHUNG E.V., München (DE)

( * ) Notice: Subject to any disclaimer, the term of this patent is extended or adjusted under 35 U.S.C. 154(b) by 265 days.

(21) Appl. No.: 16/129,866

(22) Filed: Sep. 13, 2018

(65) Prior Publication Data
US 2019/0011885 A1     Jan. 10, 2019

Related U.S. Application Data

(63) Continuation of application No. PCT/EP2017/056658, filed on Mar. 21, 2017.

(30) Foreign Application Priority Data

Mar. 22, 2016   (DE) ..................... 10 2016 204 703.5

(51) Int. Cl.
*G03H 1/22*     (2006.01)
*G02B 27/09*    (2006.01)
(Continued)

(52) U.S. Cl.
CPC ....... *G03H 1/2294* (2013.01); *G02B 27/0933* (2013.01); *G02B 27/0944* (2013.01);
(Continued)

(58) Field of Classification Search
CPC .. G03H 1/2294; G03H 1/02; G03H 2001/221; G03H 2001/0094;
(Continued)

(56) References Cited

U.S. PATENT DOCUMENTS

| 5,661,591 A | 8/1997 | Lin et al. |
| 6,563,567 B1 | 5/2003 | Komatsuda et al. |

(Continued)

FOREIGN PATENT DOCUMENTS

| DE | 102006004301 A1 | 8/2007 |
| DE | 10 2008 040581 A1 | 2/2010 |

(Continued)

OTHER PUBLICATIONS

International Search Report for PCT/EP2017/056658 dated Jun. 14, 2017.

*Primary Examiner* — Jade R Chwasz
(74) *Attorney, Agent, or Firm* — McClure, Qualey & Rodack, LLP

(57) ABSTRACT

Apparatus for generating an optical pattern from image points in an image plane, including: a control unit; a micro-mirror array; an illumination unit controllable by the control unit; a focusing unit; the control unit being configured to control one or several micro-mirror groups formed of several micro-mirrors of the multitude of micro-mirrors such that the centroid beams reflected at the micro-mirrors of one of the micro-mirror groups meet in the image plane, and such that optical path lengths of the centroid beams reflected at the micro-mirrors of the respective micro-mirror group are equal from the illumination unit up to the image plane or differ by an integer multiple of a wavelength of the light beams in order to generate an image point of the image points in such a way.

13 Claims, 11 Drawing Sheets

(51) Int. Cl.
*G03H 1/02* (2006.01)
*G03H 1/00* (2006.01)
*G03F 7/20* (2006.01)

(52) U.S. Cl.
CPC ............ *G03F 7/70291* (2013.01); *G03H 1/02* (2013.01); *G03H 2001/0094* (2013.01); *G03H 2001/0224* (2013.01); *G03H 2001/221* (2013.01); *G03H 2225/24* (2013.01)

(58) Field of Classification Search
CPC ........ G03H 2225/24; G03H 2001/0224; G03F 7/70291; G02B 27/0933; G02B 27/0944; G02B 27/0172; G02B 2027/0174; G02B 27/0103; G02B 26/0833; G02B 5/08
See application file for complete search history.

(56) References Cited

U.S. PATENT DOCUMENTS

| | | | |
|---|---|---|---|
| 6,987,599 | B2 | 1/2006 | Sandstrom |
| 7,068,417 | B2 | 6/2006 | Yang |
| 8,335,028 | B2 | 12/2012 | Renaud-Goud |
| 8,379,187 | B2 | 2/2013 | Tanitsu |
| 8,767,175 | B2* | 7/2014 | Sandstrom ............ G03B 27/54 |
| | | | 355/53 |
| 8,957,349 | B2 | 2/2015 | Matsumoto et al. |
| 2004/0053143 | A1 | 3/2004 | Sandstrom |
| 2006/0028709 | A1 | 2/2006 | Cho et al. |
| 2006/0171263 | A1 | 8/2006 | Cho et al. |
| 2009/0086296 | A1* | 4/2009 | Renaud-Goud ...... G03H 1/2294 |
| | | | 359/9 |
| 2015/0331330 | A1 | 11/2015 | Markle et al. |

FOREIGN PATENT DOCUMENTS

| | | |
|---|---|---|
| WO | 2007131817 A1 | 11/2007 |
| WO | 2011107601 A1 | 9/2011 |

* cited by examiner

APPARATUS AND METHOD FOR GENERATING AN OPTICAL PATTERN FROM IMAGE POINTS IN AN IMAGE PLANE

CROSS-REFERENCES TO RELATED APPLICATIONS

This application is a continuation of copending International Application No. PCT/EP20171056658, filed Mar. 21, 2017, which is incorporated herein by reference in its entirety, and additionally claims priority from German Application No. DE 10 2016 204 703.5, filed Mar. 22, 2016, which is incorporated herein by reference in its entirety.

This invention relates to an apparatus and a method for generating a programmable optical pattern.

BACKGROUND OF THE INVENTION

A multitude of apparatuses for generating optical patterns is already known. For example, in a classic slide projector, light is absorbed by the slide wherever the intensity in the desired pattern is to be small. This works with a high resolution (number of distinguishable image points), however—depending on the image content—the light output may be quite snail due to the absorption, and a pattern change involves a complete change of the slide. In addition to the undesired light loss itself, heating of the slide due to the absorption may also lead to problems.

A type of further development of the slide projector is the so-called bearer, in which, instead of the slide, a freely programmable spatial light modulator (SLM) defines the pattern. The spatial light modulator may work either micro-mechanically (with micro-mirrors, particularly common is the DLP technology from Texas instruments) or with liquid crystals (LCD, LCoS). It allows the computer-controlled generation of a wide variety of optical patterns without prior production of individual slides. In addition, the absorption of light is spatially separated from the spatial light modulator, which is advantageous. However, it remains unfavorable that locations of low intensity may only be reached by the absorption of the (expensively generated) radiation. This is particularly unfavorable if the desired patterns are to comprise a large proportion of dark locations and only small areas with particularly high peak intensities. For example, this occurs in optical material processing, e.g., by melting or ablation.

To avoid light losses due to absorption, the pattern generation by means of diffractive optical elements (DOE) is already known in the conventional technology. Such a diffractive optical element modulates the incident light beam in its phase in such a way that it is effectively split according to the desired pattern in several partial beams, as described in document [1], for example. The pattern to be generated appears here in the far field, or in the focusing plane of a lens, if the radiation incident on the diffractive optical element is a plane wave (alternatively, the illumination may also take place with convergent or divergent light, the image is then created elsewhere, which is not essential here). Unlike a slide, the diffractive optical element is not imaged in reality.

In the simplest case, the diffractive optical element consists of a transparent or reflective plate structured on one side. However, a corresponding new diffractive optical element needs to be produced to project another pattern. This principle of pattern generation is used in the illumination beam path of current semiconductor lithography machines, for example.

Pattern generation according to the principle of diffractive optical elements may be quickly made variable with programmable spatial light modulators, as is disclosed in document [2], for example. In principle, phase shifting spatial light modulators, which may have micro-mirrors or liquid crystals, are suitable for this purpose. The disadvantage here is that a diffractive optical element involves for a good image quality in terms of resolution and the illuminated angle range an extremely large number of extremely small pixels with dimensions close to the light wave length. While this is easily achieved in solid, etched diffractive optical elements, the extreme reduction in size of the active pixels of a spatial light modulator is technically much more difficult and expensive. In addition, control data also needs to be calculated for all of these pixels and be transferred to the spatial light modulator, which also involves a great deal of effort.

Another approach is therefore structures with spatial light modulators which pursue an incoherent pattern generation according to the beau-steering principle, e.g., disclosed by document [3], in particular FIG. 10. Such spatial light modulators comprise two-dimensionally tiltable micro-mirrors, whose deflection is often referred to as tip tilt function and which are much larger than the light wavelength used. Each one of these micro-mirrors therefore essentially reflects those partial beams of the incident light that fall on it according to the principle of angle of reflection equals angle of incidence. When illuminated with a plane wave, the desired light pattern is created by appropriate deflection of all micro-mirrors from the respective partial beams in the far field, or in the focus of a lens. This method is characterized in principle by the fact that the partial beams, which originate from different micro-mirrors but contribute to a common image point, superimpose themselves incoherently.

Similarly to a comparable structure with a diffractive optical element, this structure has the characteristic that all the light reflected by the spatial light modulator may be used. In this case, it is very advantageous that considerably fewer pixels are needed than with a spatial light modulator with a diffractive optical element so that much less control data has to be calculated and transmitted. However, the structure also has the disadvantage that the diffraction at the individual micro-mirrors sensitively limits the resolution and the image sharpness. In other words, the diameter of each image point of the partial views may not become smaller than caused by the diffraction at the individual micro-mirror. For a very good image quality, particularly with regard to resolution and sharpness, very large micro-mirrors therefore need to be used, which in turn may only be produced with great effort in the common MEMS processes in large micro-mirror arrays for many independent image points, in addition, the inertia moment of large micro-mirrors increases with a high power of the lateral dimensions, the exact value of the power depending on the scaling of the mirror thickness, which also needs to be increased for an acceptable planarity. With limited drive voltages and drive forces, large micro-mirrors may therefore only be moved much more slowly than smaller ones.

SUMMARY

According to an embodiment, an apparatus for generating an optical pattern from image points in an image plane may have a control means for controlling the generation of the optical pattern; a micro-mirror array for reflecting light beams that are incident on the micas mirror array in a planar manner, wherein the micro-mirror array comprises a multitude to micro-mirrors, each being tiltable by the control means about at least one axis so that a direction of a centroid beam of the light beams reflected at the respective micro-mirror is adjustable; an illumination means controllable by the control means for generating the light beams, configured such that the light beams are at least partially spatially coherent; a focusing means for focusing onto the image plane the light beams reflected at the multitude of micro-mirrors of the micro-mirror array; the control means being configured to control one or several micro-mirror groups formed of several micro-mirrors of the multitude of micro-mirrors such that the centroid beams reflected at the micro-mirrors of one of the micro-mirror groups meet in the image plane, and such that optical path lengths of the centroid beams reflected at the micro-mirrors of the respective micro-mirror group are equal from the illumination means up to the image plane or differ by an integer multiple of a wavelength of the light beams in order to generate an image point of the image points in such a way.

According to another embodiment, a method for generating an optical pattern from image points in an image plane may have the steps of: controlling the generation of the optical pattern by means of a control means; reflecting light beams that are incident on a micro-mirror array in a planar manner, the micro-mirror array comprising a multitude of micro-mirrors, each being tilted about at least one axis by the control means in order to adjust a direction of a centroid beam of the light beams reflected at the respective micro-mirror; generating the light beams by means of an illumination means controlled by the control means, the light beams being generated such that they are at least partially spatially coherent; focusing on the image plane the light beams reflected at the multitude of micro-mirrors of the micro-mirror array via a focusing means; using the control means for controlling a micro-mirror group formed of several micro-mirrors of the multitude of micro-mirrors so that the centroid beams reflected at the micro-mirrors of the micro-mirror group meet in the image plane and so that optical path lengths of the centroid beams reflected at the micro-mirrors of the micro-mirror group are equal from the illumination means up to the image plane or differ by an integer multiple of a wavelength of the light beams in order to generate an image point of the image points in such a way.

The object is solved by an apparatus for generating a two-dimensional optical pattern from image points in an image plane, comprising:

a control means for controlling the generation of the optical pattern;

a micro-mirror array for reflecting light beams that are incident on the micro-mirror array in a planar manner, wherein the micro-mirror array comprises a multitude to micro-mirrors, each being tiltable by the control means about at least one axis so that a direction of a centroid beam of the light beams reflected at the respective micro-mirror is adjustable;

an illumination means controllable by, the control means for generating the light beams, configured such that the light beams are at least partially coherent in a planar manner;

a focusing means for focusing onto the image plane the light beams reflected at the multitude of micro-mirrors of the micro-mirror array;

the control means being configured to control one or several micro-mirror groups formed of several micro-mirrors of the multitude of micro-mirrors such that the centroid beams reflected at the micro-mirrors of one of the micro-mirror groups meet in the image plane, and such that optical path lengths of the centroid beams reflected at the micro-mirrors of the respective micro-mirror group are equal from the illumination means up to the image plane or differ by an integer multiple of a wavelength of the light beams in order to generate an image point of the image points in such a way.

In particular, the control apparatus may be a digital electronic control apparatus, particularly a computer.

A centroid beam of the light beams reflected at a micro-mirror is understood to be the light beam that will reflect at the center of gravity of the mirror surface of the respective micro-mirror. With a rectangular mirror surface, for example, the center of gravity is defined by the point of intersection of the diagonals of the mirror surface.

The illumination means is configured such that the generated light beams are essentially coherent at least in a spatial area of one of the micro-mirror groups.

The focusing means may be arranged between the micro-mirror array and the image plane or between the illumination means and the micro-mirror array.

The solution to the above-task is based on the above-described beam-steering structure, using at least partially spatially coherent light beams that interfere in the image plane, the phases of the interfering centroid beams being controlled.

The essential difference between the inventive apparatus and the apparatus known from document [3] is that at least partially coherent light is used which interferes in the image plane, the phases of the interfering centroid beams being adjusted by adjusting their optical path lengths.

In the inventive apparatus, the micro-mirrors of the respective micro-mirror group are controlled such that the essentially coherent light beams of the micro-mirrors of the micro-mirror group constructively superimpose themselves in order to generate an image point in such a way. For this, the micro-mirrors of the respective micro-mirror groups are tilted such that, on the one hand, the centroid beams reflected at the micro-mirrors of one of the micro-mirror groups meet in the image plane in a center of the image point, and such that the optical path lengths of the centroid beams reflected at the micro-mirrors of the respective micro-mirror group are equal from the illumination means to the image plane or differ by an integer multiple of a wavelength of the light beams.

By adjusting the optical path lengths, the centroid beams arriving at the center of the image point comprise the phase position. This prevents that the coherent light beams generate undesired deflection patterns which would cause the image point to be divided to several image points, thus, increasing the image noise.

According to the invention, for each image point in the image plane, the micro-mirrors of a micro-mirror group are controlled such that the centroid beams reflected at the micro-mirrors of one of the micro-mirror groups meet exactly in the center of the desired image point. The control means may be configured such that the micro-mirrors of a micro-mirror group are aligned in parallel for generating an image point in order to achieve that the centroid beams reflected at the micro-mirrors of one of the micro-mirror groups meet exactly in the center of the desired image point. The spatial position of the micro-mirrors involved is calculated and adjusted in such a way that the optical path length of all of these centroid beams is equal from the illumination means to the image plane or respectively differs by an integer multiple of the used light wavelength. This may be accurate to a small fraction of the used light wavelength, e.g., 5%, better 1%.

Thus, all centroid beams of a micro-mirror group interfere constructively, which generates a correspondingly high intensity. In the surrounding area of this point, different phase relationships of the light beams reflected at the respective micro-mirror inevitably result, which automatically results in a steep drop in intensity and, thus, a sharp image point. With good micro-mirror quality and precise control, the diameter of this image point may be as small as corresponds to the diffraction at a single micro-mirror of the size of the entire group of micro-mirrors used. For example, a micro-mirror group of 16 micro-mirrors may therefore generate an image point of $\frac{1}{16}$ of the area that would originate from a single one of these micro-mirrors. The intensity in the center of this image point increases to 256-times ($=16^2$). In comparison, an incoherent superimposition of the reflected light beams with a micro-mirror group of 16 micro-mirrors results in an image point with the original width and length as well as an intensity that is only 16 times higher.

Advantageously, the micro-mirrors of one of the micro-mirror groups are arranged in the manner of a square matrix (n×n matrix). In this case, the same sharpness results for the longitudinal direction and the width direction of the image point. Fundamentally, however, the micro-mirrors of one of the micro-mirror groups may be arranged in the manner of any m×n matrix.

In this case, the micro-mirrors of one of the micro-mirror groups are adjustable independently of the micro-mirrors of the other micro-mirror groups in order to be able to generate different image points.

The invention allows the projection of an optical pattern determined directly from a computer without individual production of auxiliary elements such as masks or diffractive optical elements. The micro-mirror array simultaneously allows the positioning of the image points and the production of phase coincidence of the centroid beams of the image points. The pattern generation principle of the inventive apparatus is not based on the absorption of the light that is already generated, thus, offers a high light output and comprises a high resolution and precision of the pattern reproduction.

The invention is particularly suitable for applications involving in a dark environment light points that are as bright as possible, which may be freely positioned and adjusted with regard to theft intensity. Particular mention should be made here of material processing, particularly ablation, but also thermal treatment up to melting the surface of a workpiece. Chemically influencing a workpiece, or a photoresist, is also conceivable, e.g., in lithography. The use in other devices for pattern generation is also possible.

In an embodiment of the inventive apparatus, the individual micro-mirrors of the micro-mirror array are tiltable about exactly one first axis and are otherwise fixed. In this case, the micro-mirrors of a row of the micro-mirror array may be tiltable about a mutual first axis which is aligned in parallel to the row. The micro-mirrors of the other rows are each tiltable about a further mutual first axis, wherein the first axes of the different rows may each be aligned in parallel towards each other. The micro-mirrors of a micro-mirror group may be tiltable independently of the micro-mirrors of the other micro-mirror groups about the respective first axis in order to simultaneously generate several image points that are offset transversely to the first axis. Rows and columns of the micro-mirror array may be switched accordingly. When the micro-mirrors are only tiltable about a first axis, the generation of one-dimensional optical patterns is possible.

However, the condition of phase coincidence of the centroid beams in a micro-mirror group, which are mutually used for an image point, may only be fulfilled for discrete image points, wherein the distance of the possible image points depends on the grid of the micro-mirror array. Thus, the continuum of possible image points in the image plane is restricted to the discrete grid of the diffraction orders of the micro-mirror array. However, the advantage of this embodiment is that the amount of control data involved for the micro-mirror array is comparatively small.

The restriction to a specified grid of possible image points may seem very unfavorable at first; however, an application for pattern generation may make sense. For example, individual markings on products may be produced by means of ablation. In this case, a high peak intensity is important, wherein the optical pattern may also be easily detected when the individual image points are clearly separated from each other. Further embodiments without this restriction are disclosed below.

According to an advantageous further implementation of the invention, a length of the micro-mirrors and/or a width of the micro-mirrors is at least 5-times, advantageously at least 10-times and particularly advantageously 20-times the wavelength of the light beams. In this way, it may be ensured that a deflection of the light beams at the individual micro-mirrors takes place according to the equation angle of incidence=angle of detection. Furthermore, the number of the involved micro-mirrors may be kept small so that the amount of the involved control data may be kept small.

According to an efficient further implementation of the invention, the control means is configured to form one of the micro-mirror groups such that one of the micro-mirror groups is formed of neighboring micro-mirrors of the plurality of micro-mirrors. By this, it may be ensured that the light beams incident on the micro-mirrors of the micro-mirror group formed in such a way are particularly coherent so that particularly sharply limited image points may be generated. Micro-mirrors are neighboring if no other micro-mirror is located between the considered mirrors.

According to a further implementation of the invention, the control apparatus is configured to control the micro-mirror groups such that two neighboring or overlapping image points (BP) of the images points (BP) may be generated by two non-neighboring micro-mirror groups of the micro-mirror groups. By this, it is possible that image points with smoother transitions may also be generated further to the particularly sharply limited image points since the coherence of the light beams incident on the micro-mirrors of the respective micro-mirror groups decreases in practice when the micro-mirror groups are spatially spaced apart.

The micro-mirror groups are neighboring when no micro-mirror of another micro-mirror group is located between the considered micro-mirrors. Micro-mirrors are not neighboring when micro-mirrors of another micro-mirror group are located between the considered micro-mirror groups.

When using partially coherent illumination, neighboring, or overlapping, image points may be formed in the image plane by non-neighboring micro-mirror groups whose distance is above the spatial coherence length. With this, it is possible to generate broader light distributions with similar transitions further to the generation of particularly sharp image points by selecting the light beams used for generating a neighboring image point such that they are incoherent proportionally to the light beams used for generating the other neighboring image point.

According to an efficient further implementation of the invention, the control means is configured to control an intensity of the illumination means. Since the inventive apparatus uses the entire light reflected by the micro-mirror array, it is useful if the intensity of the illumination means is quickly variable. Then, at any time, exactly as much light may be generated as is currently needed according to the optical pattern to be generated. If the illumination means does not permit a sufficiently fast modulation, an absorber may be used alternatively or additionally, e.g., configured to be radiated at large micro-mirror angles and to therefore absorb light.

According to a further implementation of the invention, the micro-mirrors are each tiltable by the control means additionally about a second axis extending transversely to the first axis so that the direction of the centroid beam of the light beams reflected at the respective micro-mirror is two-dimensionally adjustable. In this case, the micro-mirrors of a column of the micro-mirror array may be tiltable about a mutual second axis aligned in parallel to a column of the micro-mirror array. The micro-mirrors of the other column are each tiltable independently of each other about a further mutual second axis, wherein the second axes of the different columns may each be aligned in parallel towards each other. The micro-mirrors of a micro-mirror group may be tiltable independently of the micro-mirrors of the other micro-mirror groups about the second axes in order to simultaneously generate several image points transversely offset to the respective second axis. Rows and columns of the micro-mirror array may be switched accordingly. If the micro-mirrors are tiltable about a first axis and a second axis, the generation of two-dimensional optical patterns is possible.

According to an efficient further implementation of the invention, the control means is configured to form one of the micro-mirror groups such that one of the micro-mirror groups is formed of two-dimensionally arranged micro-mirrors of the multitude of micro-mirrors. In this way, a micro-mirror group may be formed whose micro-mirrors are arranged particularly close to each other so that the light beams incident thereon are particularly coherent so that particularly sharp image points may be generated.

According to an efficient further implementation of the invention, the micro-mirrors are each displaceable by the control means along a travel direction extending transversely to a mirror surface of the respective micro-mirror so that the optical path length of the centroid beam reflected at the respective micro-mirror is variable.

If this feature is provided in an embodiment in which the micro-mirrors are tiltable exactly about the first axis, the image points may be continuously generated on a line since the phase condition for each point of the line may be ensured by adjusting the travel. Particularly in applications that have different requirements for the two coordinate axes in the image plane, the effort for manufacturing and, above all, calibration and control of the micro-mirror array may be reduced.

If this feature is provided in an embodiment in which the micro-mirrors are tiltable about the first axis and about the second axis, it is possible to generate image points at any location in the image plane, i.e., without adhering to a grid, since the phase condition may be ensured for each location of the image plane by adjusting the travel.

According to an efficient further implementation of the invention, the control means is configured to control a displacement means configured to displace a radiatable region in a displacement direction relative to an object to be radiated.

A radiatable region may be understood to be any region in which an optical pattern may be generated in one operation, or with one light pulse. The shape and size of the radiatable region depends on the degrees of freedom of the micro-mirrors, on the focal length of the focusing means and on the possible deflection angles of the micro-mirrors. If regions outside of the radiatable region are to be radiated, this may be achieved by relatively displacing the object to be radiated with respect to the radiatable region and by several light pulses so that a larger radiatable total region is created. This may also be referred to as stitching of optical partial patterns.

According to a further implementation of the invention, the displacement means is configured as a mechanical displacement means. The mechanical displacement means may be configured such that either the optical pattern or the object to be radiated or both are moved.

According to an advantageous further implementation of the invention, the displacement means is configured as an optical displacement means. In this case, the optical displacement means may particularly comprise one or several tiltable mirrors and/or one or several rotating polygon mirrors.

According to a further implementation of the invention, the displacement means is configured such that the displacement direction extends obliquely to a point grid of the optical pattern. With this, it is possible by means of a displacement to displace an image grid of possible image points in such a way across the object to be radiated that a radiatable region completely covers the object to be radiated.

In a further aspect, the object is solved by a method for generating an optical pattern of image points in an image plane, comprising:

controlling the generation of the optical pattern by means of a control means;

reflecting light beams that are incident on a micro-mirror array in a planar manner, the micro-mirror array comprising a multitude of micro-mirrors, each being tilted about at least one axis by the control means in order to adjust a direction of a centroid beam of the light beams reflected at the respective micro-mirror;

generating the light beams by means of an illumination means controlled by the control means, the light beams being generated such that they are at least partially spatially coherent;

focusing on the image plane the light beams reflected at the multitude of micro-mirrors of the micro-mirror array via a focusing means;

using the control means for controlling a micro-mirror group formed of several micro-mirrors of the multitude of micro-mirrors so that the centroid beams reflected at the micro-mirrors of the micro-mirror group meet in the image plane and so that optical path lengths of the centroid beams reflected at the micro-mirrors of the micro-mirror group are equal from the illumination means up to the image plane or differ by an integer multiple of a wavelength of the light beams in order to generate an image point of the image points in such a way.

Advantages and possible further implementations are described based on the inventive apparatus.

BRIEF DESCRIPTION OF THE DRAWINGS

Embodiments of the present invention will be detailed subsequently referring to the appended drawings, in which:

FIG. 6 shows a partial view of a fifth embodiment of the inventive apparatus in a schematic illustration in a x-y plane;

DETAILED DESCRIPTION OF THE INVENTION

Figure 1:
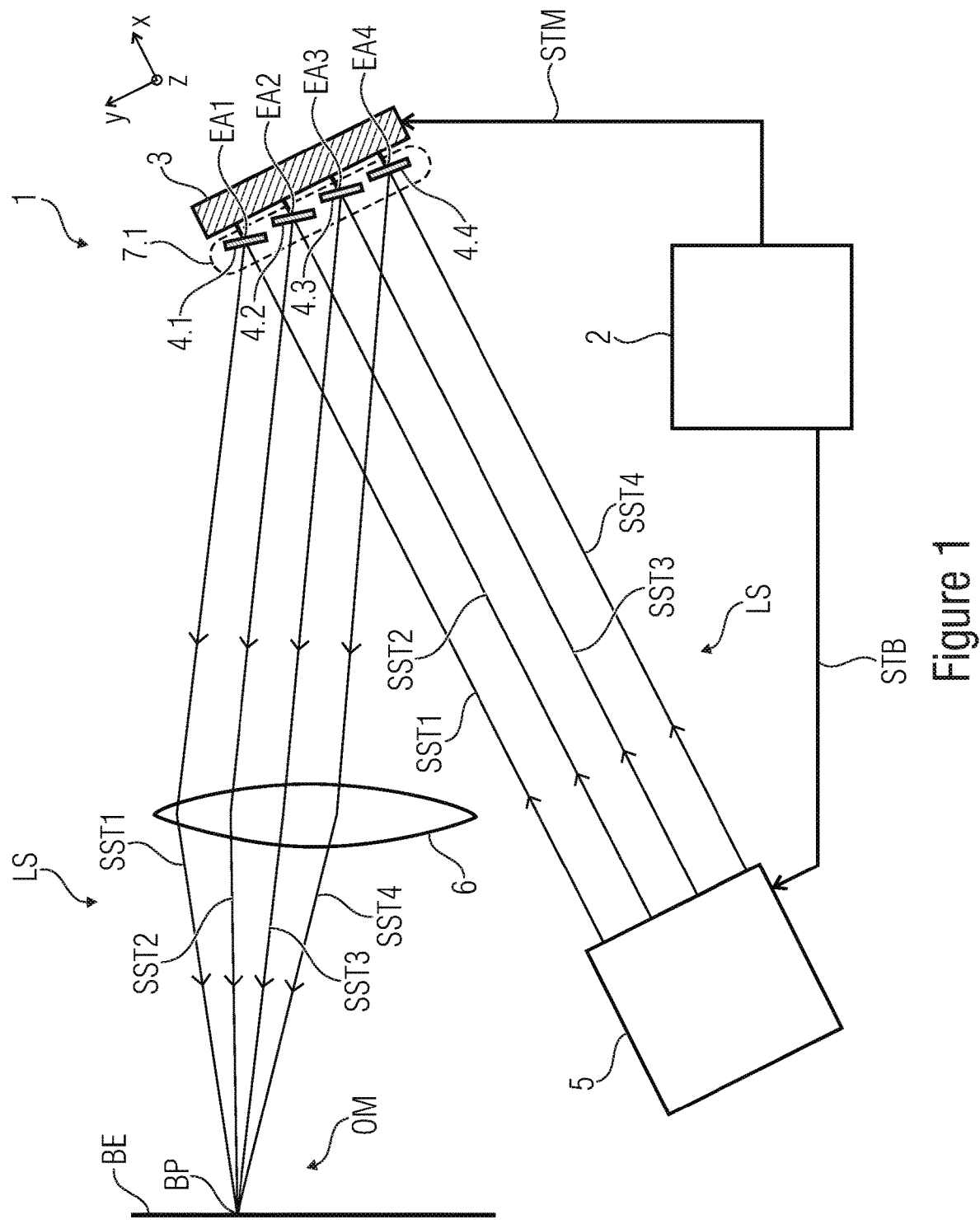
FIG. 1 shows a first embodiment of an inventive apparatus in a schematic illustration in a x-y plane.

The same or similar elements or elements having the same or equivalent functions are provided with the same or similar reference numerals below.

In the following description, embodiments having a plurality of features of the present invention will be described in more detail in order to present a better understanding of the invention. However, it should be noted that the present invention may also be implemented by omitting individual ones of the described features. It should also be noted that features shown in different embodiments may also be combined in other ways as long as this is not specifically excluded or would results in any contradictions.

FIG. 1 shows a first embodiment of an inventive apparatus 1 in a schematic illustration. The apparatus for generating an optical pattern OM of image points BP in an image plane BE includes:

a control means 2 for controlling the generation of the optical pattern OM;

a micro-mirror array 3 for reflecting light beams LS that are incident on the micro-mirror array 3 in a planar manner, wherein the micro-mirror array 3 comprises a multitude to micro-mirrors 4, each being tiltable by the control means 2 about at least one axis EA so that a direction of a centroid beam SST of the light beams LS reflected at the respective micro-mirror 4 is adjustable;

an illumination means 5 controllable by the control means 2 for generating the light beams LS, configured such that the light beams LS are at least partially spatially coherent;

a focusing means 6 for focusing onto the image plane BE the light beams LS reflected at the multitude of micro-mirrors 4 of the micro-mirror array 3;

the control means 2 being configured to control one or several micro-mirror groups 7 formed of several micro-mirrors 4 of the multitude of micro-mirrors 4 such that the centroid beams SST reflected at the micro-mirrors 4 of one of the micro-mirror groups 7 meet in the image plane BE, and such that optical path lengths of the centroid beams SST reflected at the micro-mirrors 4 of the respective micro-mirror group 7 are equal from the illumination means 5 up to the image plane BE or differ by an integer multiple of a wavelength of the light beams LS in order to generate an image point EP of the image points BP in such a way.

In the view of FIG. 1, only one column of the micro-mirror array 3 is visible, e.g., four micro-mirrors 4.1 to 4.4. 3 further columns of the micro-mirror array 3 are covered.

However, this is to be understood as an example as, in practice, significantly more columns each having significantly more mirrors 4 may be provided.

With respect to the light beams LS, only a centroid beam SST1 reflected at the micro-mirror 4.1, a centroid beam SST2 reflected at the micro-mirror 4.2, a centroid beam SST3 reflected at the micro-mirror 4.3, and a centroid beam SST4 reflected at the micro-mirror 4.4 are illustrated.

In this case, the image point BP is generated by an interfering superimposition of the coherent centroid beams SST1 to SST4.

The control means 2 is configured to control the micro-mirror array 3 by means of control data STM and to control the illumination means 5 by means of control data STB.

According to an advantageous further implementation of the invention, the control means 2 is configured to control an intensity of the illumination means 5. Since the inventive apparatus 1 uses the entire light reflected by the micro-mirror array 3, it is useful if the intensity of the illumination means 5 is quickly variable. Then, at any time, exactly as much light LS may be generated as is currently needed according to the optical pattern OM to be generated. If the illumination means 5 does not permit a sufficiently fast modulation, an absorber may alternatively or additionally be used, e.g., configured to be radiated at large micro-mirror arrays and to therefore absorb light LS.

In a further aspect, the invention concerns a method for generating an optical pattern OM of images points BP in an image plane BE, including:

controlling the generation of the optical pattern OM by means of a control means 2;

reflecting light beams LS that are incident on a micro-mirror array 3 in a planar manner, the micro-mirror array 3 comprising a multitude of micro-mirrors 4. Each being tilted about at least one axis EA by the control means 2 in order to adjust a direction of a centroid beam SST of the light beams LS reflected at the respective micro-mirror 4;

generating the light beams LS by means of an illumination means 5 controlled by the control means 2, the light beams LS being generated such that they are at least partially spatially coherent; focusing on the image plane BE the light beams LS reflected at the multitude of micro-mirrors 4 of the micro-mirror array 3 via a focusing means 6;

using the control means 2 for controlling a micro-mirror group 7 formed of several micro-mirrors 4 of the multitude of micro-mirrors 4 so that the centroid beams 7 reflected at the micro-mirrors 4 of the micro-mirror group 7 meet in the image plane BE and so that optical path lengths of the centroid beams SST reflected at the micro-mirrors 4 of the micro-mirror group 7 are equal from the illumination means 5 up to the image plane BE or differ by an integer multiple of a wavelength of the light beams LS in order to generate an image point BP of the image points BP in such a way.

Figure 2:
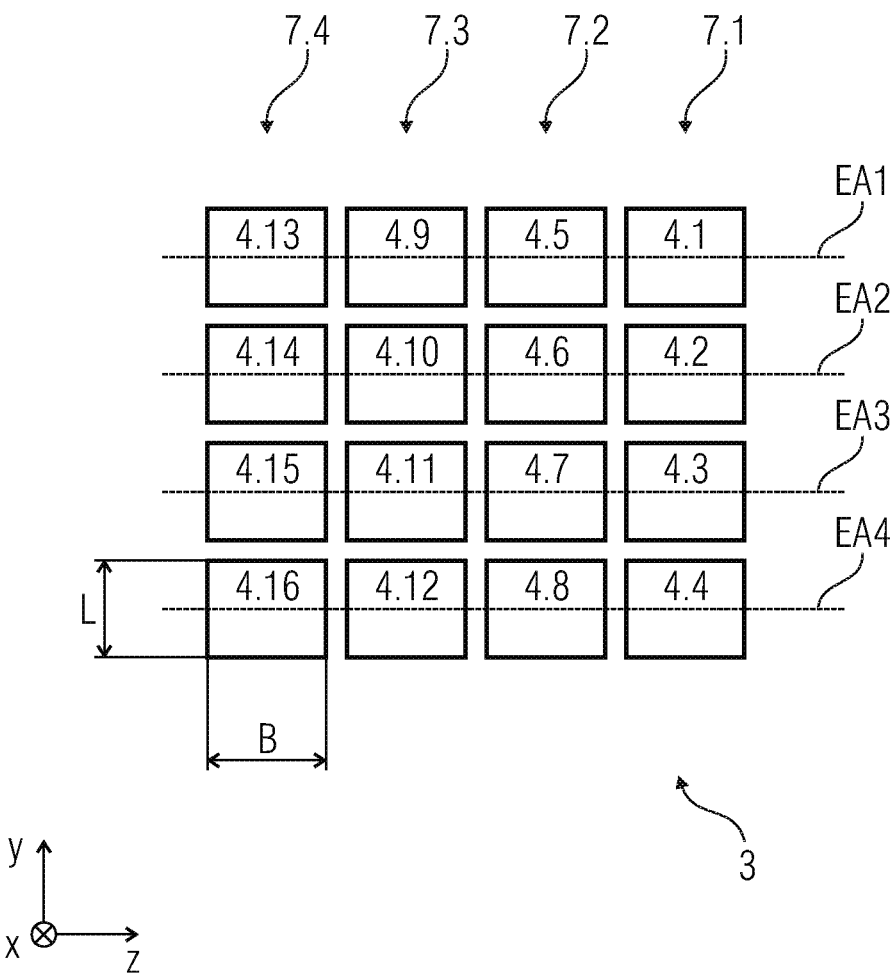
FIG. 2 shows a detailed view of the first embodiment of the inventive apparatus in a schematic illustration in a z-y plane.

FIG. 2 shows a detailed view of the first embodiment of the inventive apparatus 1 in a schematic illustration.

In the first embodiment of the inventive apparatus 1, the individual micro-mirrors 4 of the micro-mirror array 3 are tiltable about exactly one first axis EA and are otherwise fixed. The micro-mirrors 4.1, 4.5, 4.9, 4.13 of a first row of the micro-mirror array 3 may be tiltable about a first mutual first axis EA1, however, independently of each other, which is aligned in parallel to the first row. The micro-mirrors 4.2, 4.6, 4.10, 4.14 of the second row are each tiltable independently of each other about a second mutual first axis EA2, the micro-mirrors 4.3, 4.7, 4.11, 4.15 of the third row are tiltable independently of each other about a third mutual first axis EA3 and the micro-mirrors 4.4, 4.8, 4.12, 4.16 of the fourth row are tiltable independently of each other about a fourth mutual first axis EA4, wherein the first axes EA1-EA4 of the different row may each be aligned in parallel to each other.

In this case, the micro-mirror group 7.1 may be formed of the micro-mirrors 4.1, 4.2, 4.3 and 4.4, each being arranged in the same column of the micro-mirror array 3. The micro-mirror group 7.2 may be formed of the micro-mirrors 4.5, 4.6, 4.7 and 4.8, each being arranged in the same column of the micro-mirror array 3, the micro-mirror group 7.3 may be formed of the micro-mirrors 4.9, 4.10, 4.11 and 4.12, each being arranged in the same column of the micro-mirror array 3, and the micro-mirror group 7.4 may be formed of the micro-mirrors 4.13, 4.14, 4.15 and 4.16, each being arranged in the same column of the micro-mirror array 3. Thus, as an example, the micro-mirror groups are arranged according to a type of a 4×1 matrix.

If the micro-mirrors 4 are solely tiltable about a first axis EA, the generation of one-dimensional optical patterns is possible.

However, the condition of the phase coincidence of the centroid beams in a micro-mirror group 7, which are mutually used for one image point BP, may only be fulfilled for discrete image points BP, wherein the distance of the possible image points BP depends on the distance of the micro-mirrors 4. Thus, the continuum of possible image points BP in the image plane BE is restricted to the discrete grid of the diffraction orders of the micro-mirror array 3. However, the advantage of this embodiment is that the amount of control data involved for the micro-mirror array 3 and the mechanical complexity of the micro-mirror array are comparable small.

According to a further implementation of the invention, a length L of the micro-mirrors 4 and/or a width B of the micro-mirrors 4 is at least 5-times, advantageously at least 10-times and particularly advantageously at least 20-times the wavelength of the light beams LS. In this way, it may be ensured that a deflection of the light beams at the individual micro-mirrors 4 takes place according to the equation angle of incidence=of angle of deflection. Furthermore, the number of involved micro-mirrors 4 may be kept small so that the amount of the involved control data and the manufacturing effort for the micro-mirror array may be kept low.

According to an advantageous further implementation of the invention, the control means 2 is configured to form one of the micro-mirror groups 7 such that one of the micro-mirror groups 7 is formed of neighboring micro-mirrors 4 of the multitude of micro-mirrors 4. By this, it may be ensured that the light beams incident on the micro-mirrors 4 of the micro-mirror group 7 formed in such a way are particularly coherent so that particularly sharply image points BP may be generated.

According to an advantageous further implementation of the invention (not shown), the control means 2 may additionally be configured to control the micro-mirror groups 7 in such a way that two neighboring image points BP of the image points BP may be generated by two non-neighboring micro-mirror groups 7 of the micro-mirror groups 7. By this, it is possible that image points BP with smoother transitions may be generated further to the particularly sharply limited image points BP since the coherence of the light beams LS incident on the micro-mirrors 4 of the respective micro-mirror groups 7 decreases in practice when the micro-mirrors 7 are spatially spaced apart.

When using partially coherent illumination, neighboring, or overlapping, image points BP may be formed in the image plane BP by non-neighboring micro-mirror groups 7 whose distance is above the spatial coherence length. With this, it is possible to generate broader light distributions with smoother transitions further to the generation of particularly sharp image points BP by selecting the light beams LS used for generating the one neighboring image point BP such that they are incoherent proportionally to the light beams LS used for generating the other neighboring image point BP.

Figure 3:
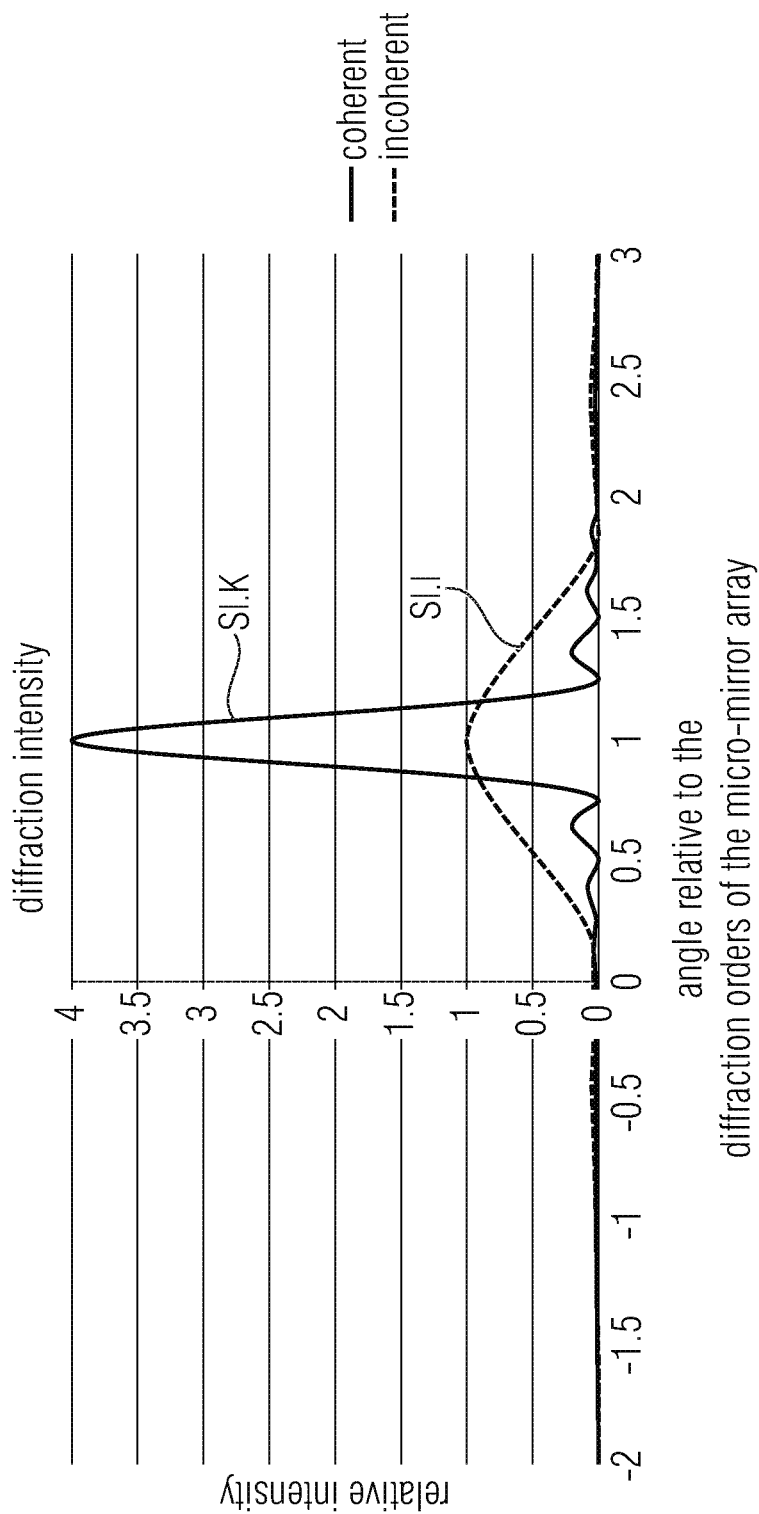
FIG. 3 shows a diagram for illustrating the operation of the first embodiment of the inventive apparatus.

FIG. 3 shows a diagram for illustrating the operation of the first embodiment of the inventive apparatus 1.

FIG. 3 shows a one-dimensional simulation of the distribution of the illumination intensity SI.K in the image plane BE at superimpositions of the coherent light bundles with the centroid beams SST1 to SST4 of the micro-mirrors 4.1 to 4.4 of the micro-mirror group 7.1 and, as a comparison, the distribution of the radiation intensity SI.I in the image plane BE at superimpositions of corresponding incoherent light bundles of 4 such micro-mirrors. It is clearly discernable that the radiation intensity SI.K reaches four times the maximum of the radiation intensity SI.I, wherein the half-intensity width decreases to ¼ so that a sharp and bright image point BP is created. However, if the travel of the micro-mirrors 4 is not adjustable, such a distribution of the radiation intensity SI.K is only possible at those discrete points at which an integer diffraction order of the grid of the micro-mirrors is present.

Figure 4:
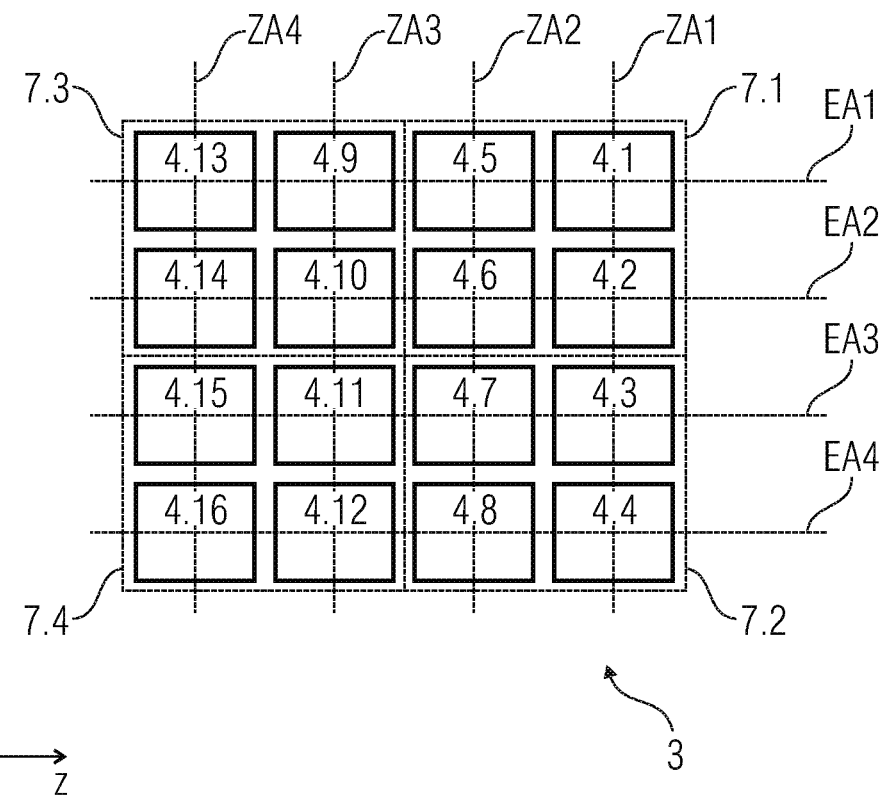
FIG. 4 shows a detailed view of a second embodiment of the inventive apparatus in a schematic illustration in a z-y plane.

FIG. 4 shows a detailed view of a second embodiment of the inventive apparatus 1 in a schematic illustration.

According to an advantageous further implementation of the invention, the micro-mirrors 4 are each tiltable by the control means 2 additionally about a second axis ZA extending transversely to the first axis EA so that the direction of the centroid beam SST of the light beams LS reflected at the respective micro-mirror 4 is two-dimensionally adjustable. In this way, the generated image point may be positioned in the image plane both in the x-direction and also in the y-direction.

The micro-mirrors 4.1, 4.2, 4.3, 4.4 of a first column of a micro-mirror array 3 may be tiltable about a first mutual second axis ZA1, however, independently of each other, which is aligned in parallel to the first column. The micro-mirrors 4.5, 4.6, 4.7, 4.8 of the second column are each tiltable independently of each other about a second mutual second axis ZA2, the micro-mirrors 4.9, 4.10, 4.11, 4.12 of the third column are tiltable independently of each other about a third mutual second axis ZA3 and the micro-mirrors 4.13, 4.14, 4.15, 4.16 of the fourth column are tiltable independently of each other about a fourth mutual second axis ZA4, wherein the second axes ZA1-ZA4 of the different columns may each be aligned in parallel towards each other.

According to an advantageous further implementation of the invention, the control means 2 is configured to form one of the micro-mirror groups 7 such that one of the micro-mirror groups 7 is formed of two-dimensionally arranged micro-mirrors 7 of the multitude of micro-mirrors 7.

In this case, the micro-mirror group 7.1 may be formed of the micro-mirrors 4.1, 4.2, 4.5 and 4.6, each being arranged in the first and second column of the micro-mirror array 3, respectively. The micro-mirror group 7.2 may be formed of the micro-mirrors 4.3, 4.4, 4.7 and 4.8, each being arranged in the first and second column of the micro-mirror array 3, respectively, the micro-mirror group 7.3 may be formed of the micro-mirrors 4.9, 4.10, 4.13 and 4.14, each being arranged in the third and fourth column of the micro-mirror array 3, respectively, and the micro-mirror group 7.4 may be formed of the micro-mirrors 4.11, 4.12, 4.15 and 4.16, each also being arranged in the third and fourth column of the micro-mirror array 3, respectively.

Figure 5:
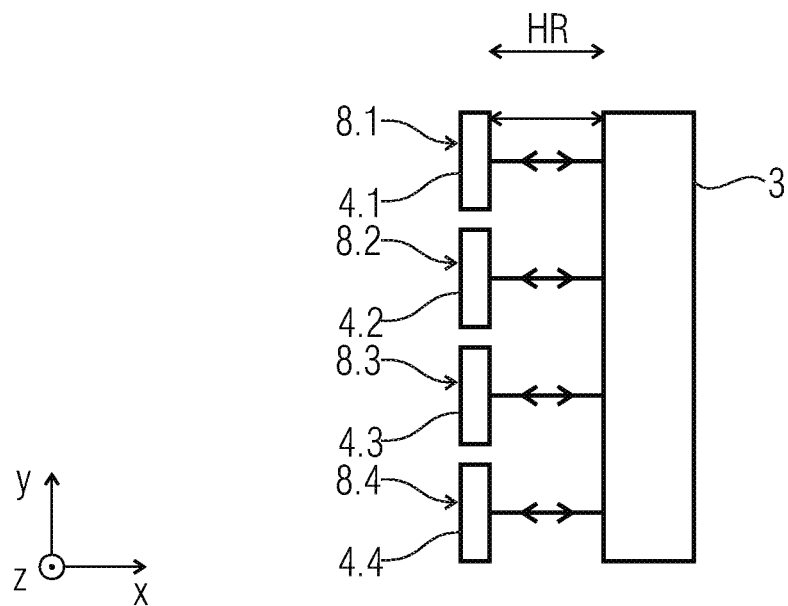
FIG. 5 shows a detailed view of a third embodiment of the inventive apparatus in a schematic illustration in a x-y plane.

FIG. 5 shows a detailed view of a third embodiment of the inventive apparatus 1 in a schematic illustration.

According to an advantageous further implementation of the invention, the micro-mirrors 4 are each displaceable by the control means 2 along a travel direction HR extending transversely to a mirror surface 8 of the respective micro-mirror 4 so that the optical path length of the centroid beam SST reflected at the respective micro-mirror 4 is variable.

If this feature is provided in the second embodiment, in which the micro-mirrors 4 are tiltable about the first axis EA and about the second axis ZA, the image points BP may be generated arbitrarily in the image plane BE, i.e., without adhering to a grid, since the phase condition may be ensured for each point of the image plane BE by adjusting the travel.

If this feature is provided in the first embodiment, in which the micro-mirrors 4 are tiltable about exactly the first axis EA, the image points BP may be continuously generated on a line since the phase condition may be ensured for each point of the line by adjusting the travel. Particularly in applications that have different requirements for the two coordinate axes in the image plane BE, the effort for manufacturing and, above all, calibration and control of the micro-mirror array 3 may be reduced. From such an image line, a 2-dimensional image may be generated by scanning transversely to its expansion. This may particularly advantageously be used if, e.g., a workpiece to be processed moves linearly past the illumination unit on a conveyer belt. See FIG. 10.

Figure 6:
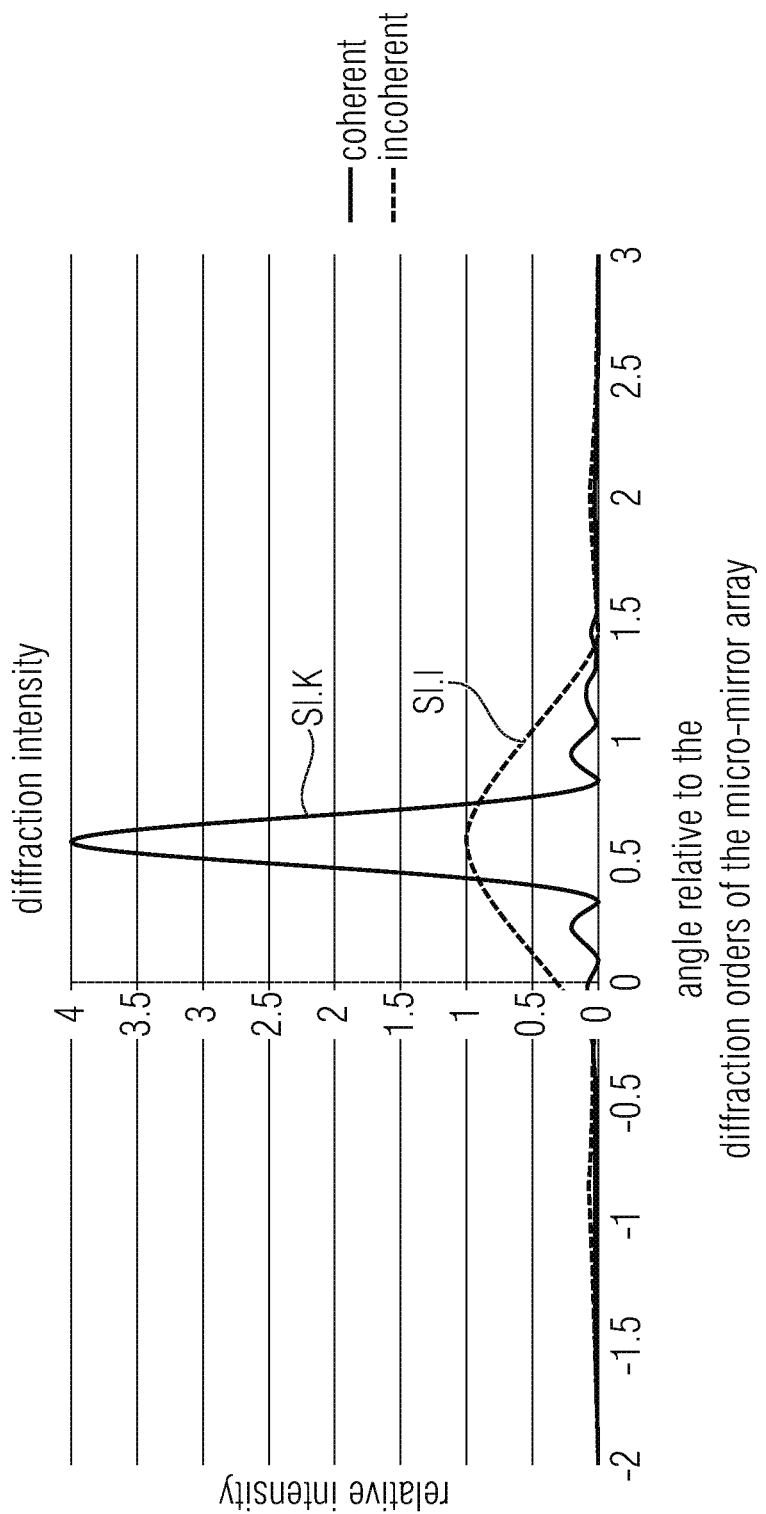
FIG. 6 shows a diagram for illustrating the operation of the third embodiment of the inventive apparatus.

FIG. 6 shows a diagram for illustrating the operation of the further implementation of the third embodiment of the inventive apparatus 1.

FIG. 6 shows a one-dimensional simulation of the distribution of the radiation intensity SI.K in the image plane BE at superimpositions of the coherent light bundles with the centroid beams SST1 to SST4 of the micro-mirrors 4.1 to 4.4 of the micro-mirror group 7.1, and, in comparison, the distribution of the radiation intensity SI.I in the image plane BE at superimpositions of corresponding incoherent light bundles of 4 such micro-mirrors. The difference to FIG. 3 is that the shown distribution of the radiation intensities SS.K and SS.I may now be achieved by adjusting the travel of the micro-mirrors independently of the locations of the integer diffraction orders of the grid of the micro-mirrors.

Figure 7:
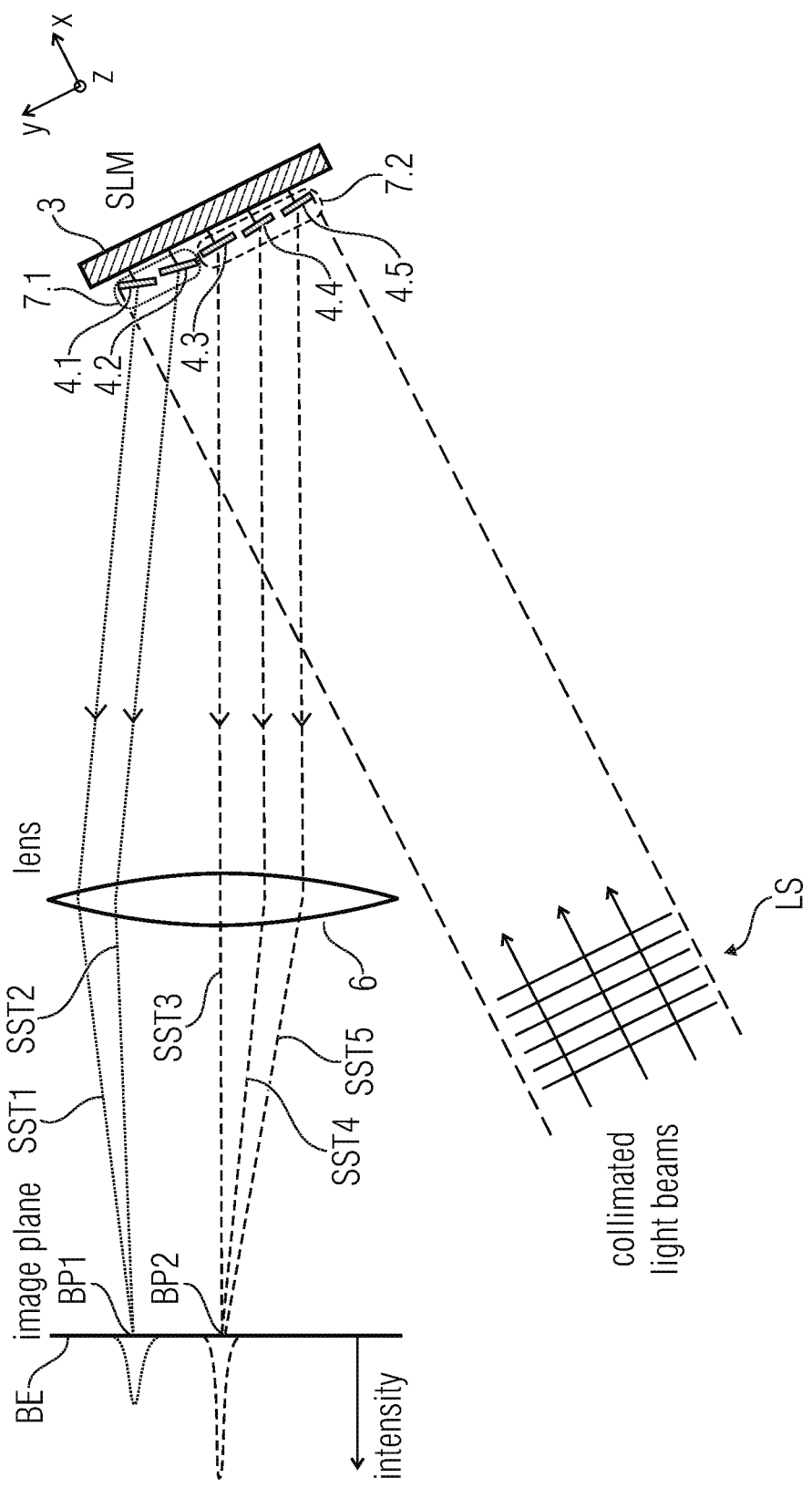
FIG. 7 shows a partial view of a fourth embodiment of the inventive apparatus in a schematic illustration in an x-y plane.

FIG. 7 shows a partial view of a fourth embodiment of the inventive apparatus in a schematic illustration in an x-y plane. Here, the micro-mirrors 4.1 and 4.2 form a first micro-mirror group 7.1. The centroid beam SST1 of the micro-mirror 4.1 and the centroid beam SST2 of the micro-mirror 4.2 are superimposed in the image plane BE, wherein the image point BP1 is created. Furthermore, the centroid beam SST3 of the micro-mirror 4.3, the centroid beam SST4 of the micro-mirror 4.4, and the centroid beam SST5 of the micro-mirror 4.5 are superimposed in the image plane BE so that the image point BP2 is created.

Since the image point BP1 is only generated by two centroid beams SST1, SST2, while the image point BP2 is generated by three centroid beams SST3, SST4, SST5, the maximum intensity of the image point BP1 is lower than the maximum intensity of the image point BP2. Due to the same reason, the half-intensity width of the image point BP1 is larger than the half-intensity width of the image point BP2.

Figure 8:
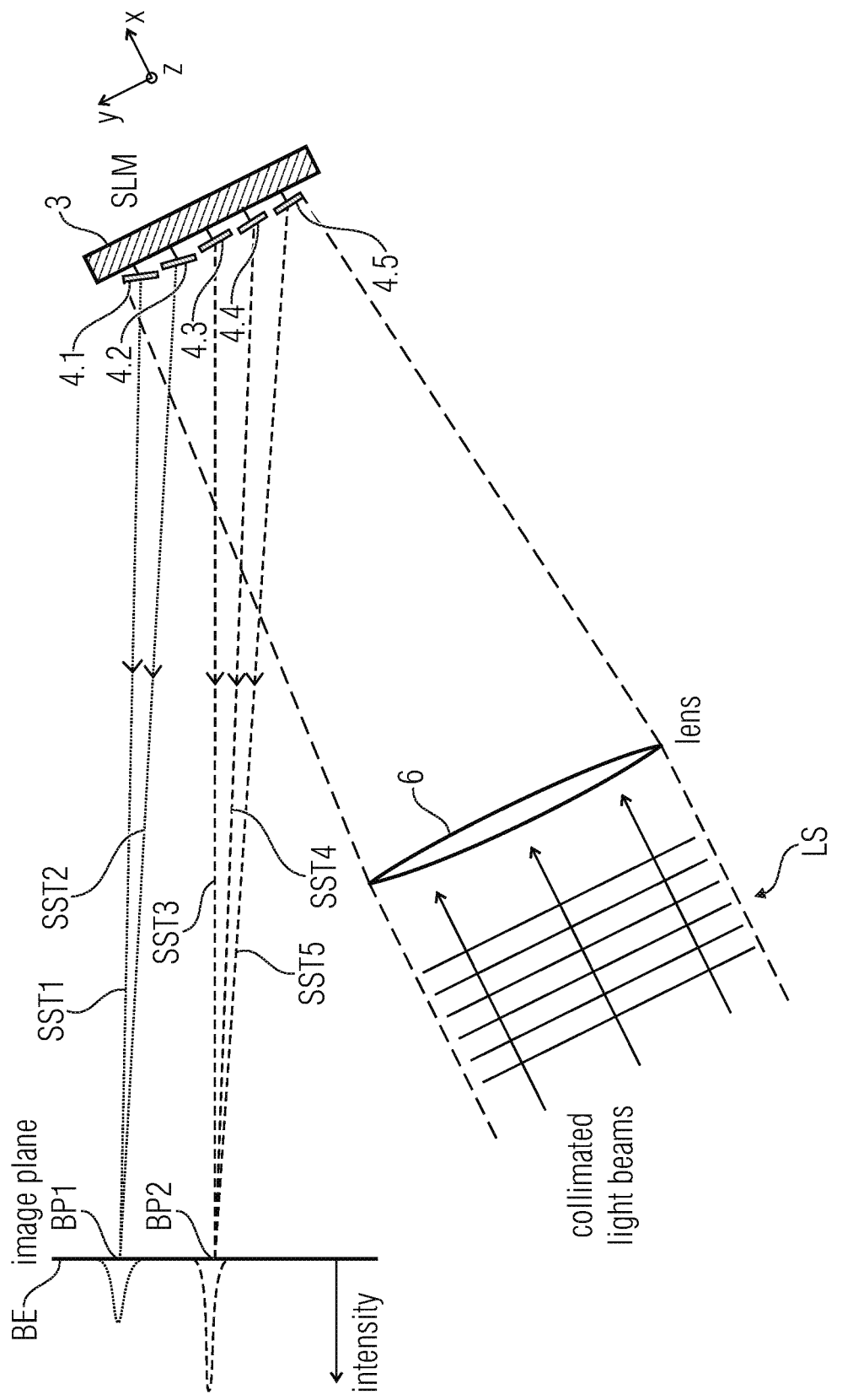

FIG. 8 shows a partial view of a fifth embodiment of the inventive apparatus in a schematic illustration in a x-y plane. The fifth embodiment is similar to the fourth embodiment. However, in the fifth embodiment, the focusing means is arranged in front of the micro-array 3, when viewed in the extension direction of the light beams LS.

Figure 9:
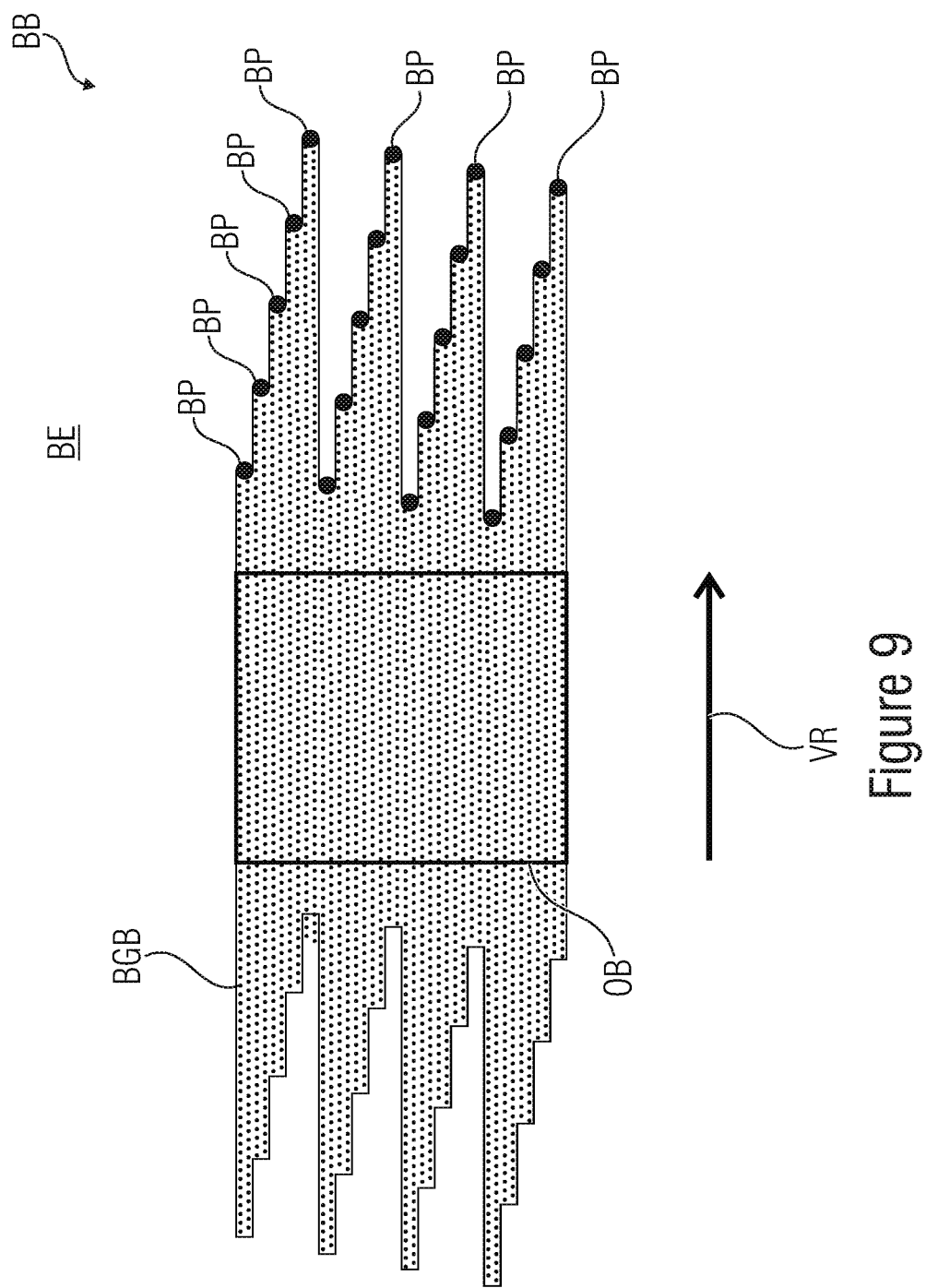
FIG. 9 shows a detailed view of a further implementation of the second embodiment of the inventive apparatus in a schematic illustration.

FIG. 9 shows a detailed view of a further implementation of the second embodiment of the inventive apparatus 1 in a schematic illustration.

According to an advantageous further implementation of the invention, the control means 2 is configured to control a displacement means that is configured to displace a radiatable region BB in a displacement direction VR relative to an object to be radiated OB. A radiatable region BB may be understood to be any region in which an optical pattern OM may be generated in one operation, or with an individual light pulse. The shape and the size of the radiatable region BB depend on the degrees of freedom of the micro-mirrors 4, on the focal length of the focusing means 6 and on the possible deflection angles of the micro-mirrors 4. If regions outside of the radiatable region are to be radiated, this may be achieved by relatively displacing the object to be radiated OB with respect to the radiatable region BB and by several light pulses so that a larger radiatable total region BGB is created. This may also be referred to as stitching of optical partial patterns. In the embodiment of FIG. 9, the radiatable region BB consists of a two-dimensional point grid with 20 possible image points. Such a two-dimers oral point grid may be generated with the micro-mirrors 4 which are tiltable about two axes EA, ZA, however, which are not adjustable in the travel direction HR.

According to an advantageous further implementation of the invention, the displacement means is configured as a mechanical displacement means. The mechanical displacement means may be configured such that either the optical pattern OM or the object to be radiated OB or both are moved.

According to an advantageous further implementation of the invention, the displacement mean is configured as an optical displacement means. In this case, the optical displacement means may particularly comprise one or several tiltable mirrors and/or one or several rotating polygon mirrors.

According to an advantageous further implementation of the invention, the displacement means VR is configured such that the displacement direction extends obliquely to a point grid of the optical pattern OM. With this, in such embodiments in which the micro-mirrors are only tiltable but not moveable in the travel direction so that image points may only be generated on a discrete point grid, it is also possible to displace the point grid of possible image points BP in such a way across the object to be radiated OB that the radiatable total region BGB completely covers the object to be radiated OB.

Figure 10:
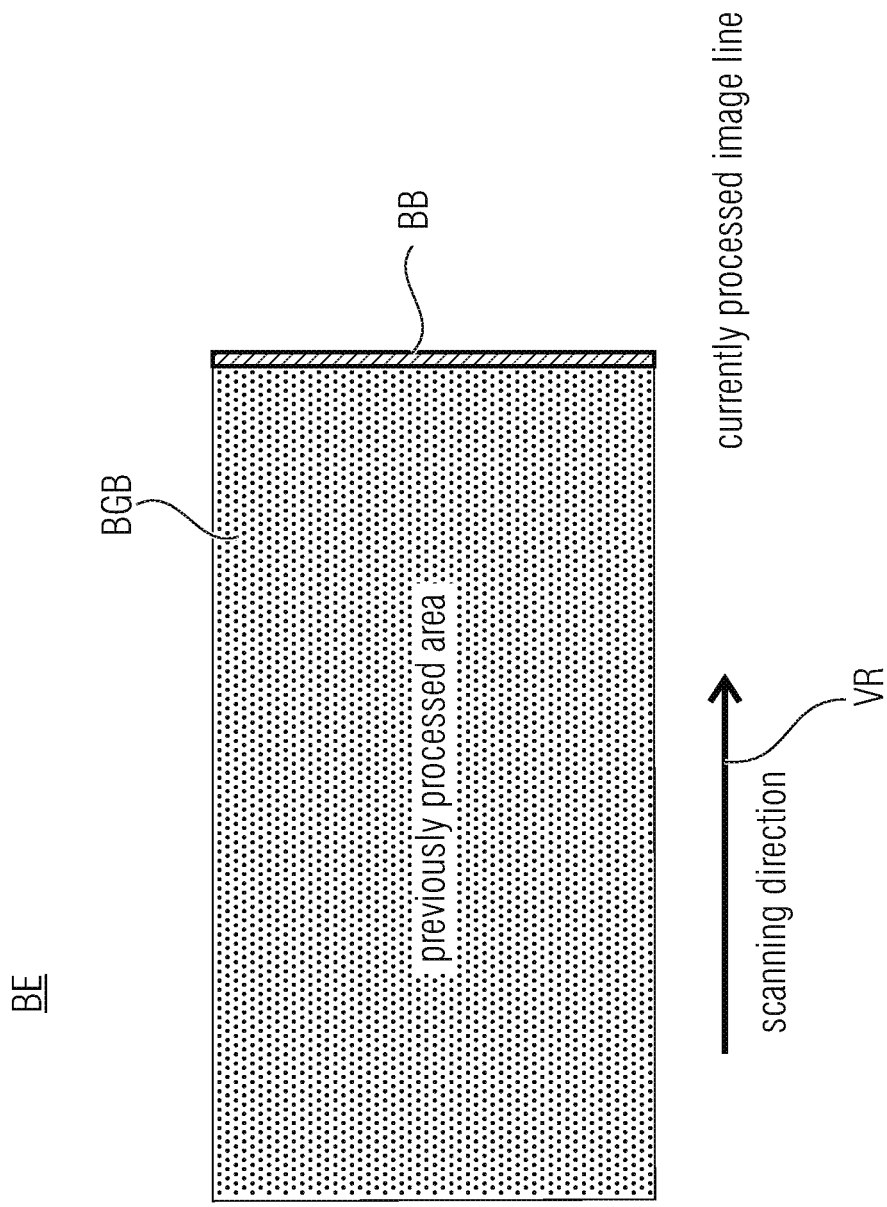
FIG. 10 shows a detailed view of a further implementation of the third embodiment of the inventive apparatus in a schematic illustration.

FIG. 10 shows a detailed view of a further implementation of the third embodiment of the inventive apparatus in a schematic illustration. In the embodiment of FIG. 10, the radiatable region BB in the image plane BE consists of a line-shaped continuum of possible image points. Since the displacement direction VR is provided transversely to the orientation of the line-shaped continuum, a square total region to be radiated BGB results. For example, a line-shaped continuously radiatable region BB may be generated with a micro-mirror 3 in which the micro-mirrors 4 are tiltable only about one axis EA, however, may also be adjusted in the travel direction HR.

Figure 11:
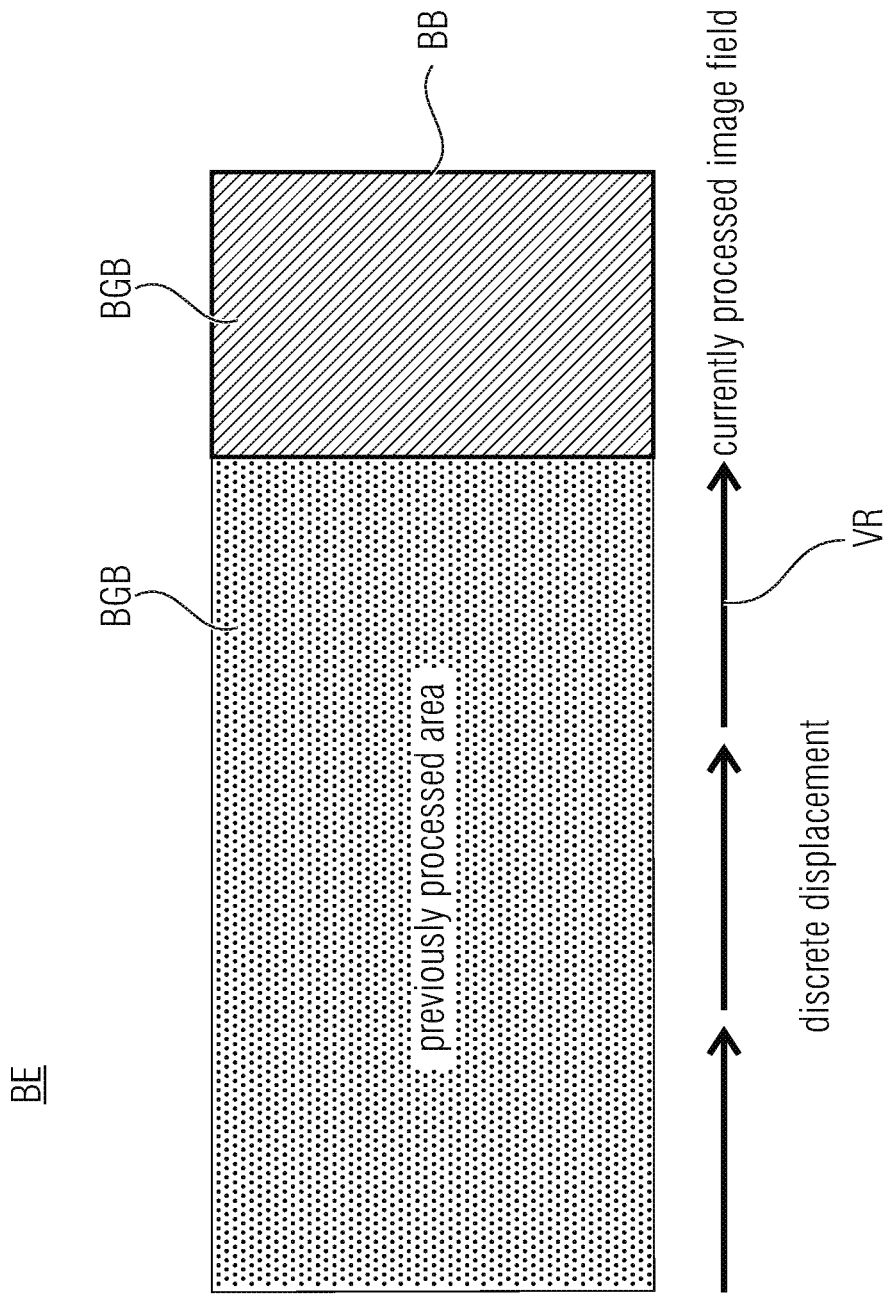
FIG. 11 shows a detailed view of a further implementation of the third embodiment of the inventive apparatus in a schematic illustration.

FIG. 11 shows a detailed view of a further implementation of the third embodiment of the inventive apparatus in a schematic illustration. In the embodiment of FIG. 11, the radiatable region BB in the image plane BE consists of a two-dimensional, or rectangular, continuum of possible image points. Through a discrete displacement of the radiatable region BB in the image plane BE and in the displacement direction VR, a radiatable total region BGB that may be significantly larger than the radiatable region BB itself is created. For example, a two-dimensional continuum of possible image points may be generated with a micro-mirror array 3 in which the micro-mirrors 4 are tiltable about two axes EA and ZA and may be adjusted in the travel direction HR.

Figure 12:
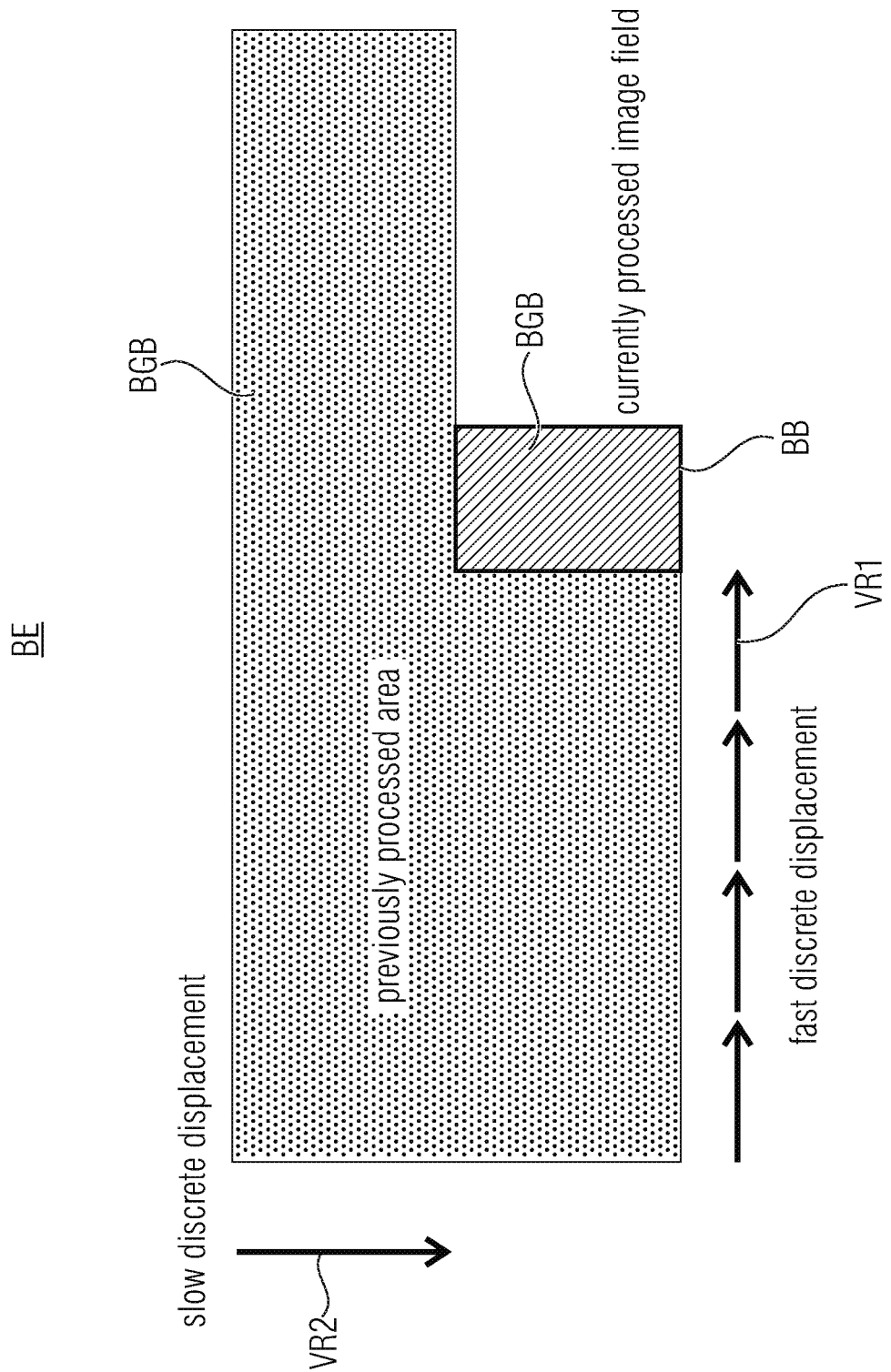
FIG. 12 shows a detailed view of a further implementation of the third embodiment of the inventive apparatus in a schematic illustration.

FIG. 12 shows a detailed view of a further implementation of the embodiment of the inventive apparatus in a schematic illustration. In the embodiment of FIG. 12, the radiatable region BB also consists of a two-dimensional continuum of possible image points. In this case, the radiatable region BB is displaceable in the image plane BE both in a first displacement direction VR1 and also in a second displacement direction VR2 so that the radiatable total region BGB may be extended in both displacement directions VR1 and VR2 with respect to the radiatable region BB.

Aspects of the invention which are herein described in the context of the inventive apparatus also represent aspects of the inventive method. Reversely, such aspects of the invention which are herein described in the context of the inventive method also represent aspects of the inventive apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCE NUMERALS 1 apparatus for generating an optical pattern
2 control means
3 micro-mirror array
4 micro-mirror
5 illumination means
6 focusing means
7 micro-mirror group
8 mirror surface
OM optical pattern
BP image point
BE image plane
LS light beams
EA first axis
SST centroid beam
STM control data for the micro-mirror array
STD control data for the illumination means
SI radiation intensity
L length
B width
ZA second axis
HR lift direction
VR displacement direction
OB object to be radiated
BB radiatable region
BGB radiatable total region

SOURCES

[1] U.S. Pat. No. 6,563,567 B1, Hideki Komatsuda et al, "Method and apparatus for illuminating a surface using a projection imaging apparatus";
[2] U.S. Pat. No. 8,957,349 B2, Naoya Matsumoto, "Laser machining device and laser machining method";
[3] U.S. Pat. No. 8,379,187 B2, Osamu Tanitsu, "Optical unit, illumination optical apparatus, exposure apparatus, and device manufacturing method".

The invention claimed is:

1. An apparatus for generating an optical pattern comprising a plurality of image points in an image plane, the apparatus comprising:
a control unit for controlling the generation of the optical pattern;
a micro-mirror array for reflecting light beams that are incident on the micro-mirror array in a planar manner, wherein the micro-mirror array comprises a multitude of micro-mirrors, each being tiltable by the control unit about at least one axis so that a direction of a centroid beam of the light beams reflected at the respective micro-mirror is adjustable;
an illumination unit controllable by the control unit for generating the light beams, configured such that the light beams are at least partially spatially coherent;
a focusing unit for focusing onto the image plane the light beams reflected at the multitude of micro-mirrors of the micro-mirror array;
wherein each image point of the plurality of image points is generated by one micro-mirror group of a plurality of micro-mirror groups, wherein each micro-mirror group of the micro-mirror groups comprises a plurality of micro-mirrors of the multitude of micro-mirrors;
wherein the control unit is configured to control each micro-mirror group of the micro-mirror groups such that at each micro-mirror group of the micro-mirror groups the centroid beams reflected at the micro-mirrors of the respective micro-mirror groups meet in the image plane, and such that at each micro-mirror group of the micro-mirror groups optical path lengths of the centroid beams reflected at the micro-mirrors of the respective micro-mirror group are equal from the illumination unit up to the image plane or differ by an integer multiple of a wavelength of the light beams in order to generate the image point of the respective micro-mirror group by constructive interference.

2. The apparatus according to claim 1, wherein a length of the micro-mirrors and/or a width of the micro-mirrors is at least 5 times the wavelength of the light beams.

3. The apparatus according to claim 1, wherein the control unit is configured to form one of the micro-mirror groups such that one of the micro-mirror groups is formed of neighbouring micro-mirrors of the multitude of micro-mirrors.

4. The apparatus according to claim 1, wherein the control unit is configured to control the micro-mirror groups such that two neighboring image points of the image points may be generated by two non-neighboring micro-mirror groups of the micro-mirror groups.

5. The apparatus according to claim 1, wherein the control unit is configured to control an intensity of the illumination unit.

6. The apparatus according to claim 1, wherein the micro-mirrors are each tiltable by the control unit additionally about a second axis extending transversally to the first axis so that the direction of the centroid beam of the light beams reflected at the respective micro-mirror is two-dimensionally adjustable.

7. The apparatus according to claim 1, wherein the control unit is configured to form one of the micro-mirror groups such that one of the micro-mirror groups is formed of two-dimensionally arranged micro-mirrors of the multitude of micro-mirrors.

8. The apparatus according to claim 1, wherein the micro-mirrors are each displaceable by the control unit along a travel direction extending transversally to a mirror surface of the respective micro-mirror so that the optical path length of the centroid beam reflected at the respective micro-mirror is variable.

9. The apparatus according to claim 1, wherein the control unit is configured to control a displacement unit that is configured for displacing a radiatable region in a displacement direction relative to an object to be radiated.

10. The apparatus according to claim 9, wherein the displacement unit is configured as a mechanical displacement unit.

11. The apparatus according to claim 9, wherein the displacement unit is configured as an optical displacement unit.

12. The apparatus according to claim 9, wherein the displacement unit is configured such that the displacement direction extends transversally to a point grid of the optical pattern.

13. A method for generating an optical pattern comprising a plurality of image points in an image plane, the method comprising:
   controlling the generation of the optical pattern by means of a control unit;
   reflecting light beams that are incident on a micro-mirror array in a planar manner, the micro-mirror array comprising a multitude of micro-mirrors, each being tilted about at least one axis by the control unit in order to adjust a direction of a centroid beam of the light beams reflected at the respective micro-mirror;
   generating the light beams by means of an illumination unit controlled by the control unit, the light beams being generated such that they are at least partially spatially coherent;
   focusing on the image plane the light beams reflected at the multitude of micro-mirrors of the micro-mirror array via a focusing unit;
   generating each image point of the plurality of image points by using one micro-mirror group of a plurality of micro-mirror groups, wherein each micro-mirror group of the micro-mirror groups comprises a plurality of micro-mirrors of the multitude of micro-mirrors;
   using the control unit for controlling each micro-mirror group of the micro-mirror groups so that at each micro-mirror group of the micro-mirror groups the centroid beams reflected at the micro-mirrors of the respective micro-mirror group meet in the image plane and so that at each micro-mirror group of the micro-mirror groups optical path lengths of the centroid beams reflected at the micro-mirrors of the respective micro-mirror group are equal from the illumination unit up to the image plane or differ by an integer multiple of a wavelength of the light beams in order to generate the image point of the respective micro-mirror group by constructive interference.

\* \* \* \* \*

UNITED STATES PATENT AND TRADEMARK OFFICE
CERTIFICATE OF CORRECTION

PATENT NO. : 11,067,953 B2
APPLICATION NO. : 16/129866
DATED : July 20, 2021
INVENTOR(S) : Peter Dürr et al.

It is certified that error appears in the above-identified patent and that said Letters Patent is hereby corrected as shown below:

In the Claims

In Column 16, Line 49 (Claim 1), please delete "groups" and insert therefor --group--

Signed and Sealed this
Twenty-fourth Day of May, 2022

Katherine Kelly Vidal
*Director of the United States Patent and Trademark Office*